United States Patent [19]

Kusakabe

[11] Patent Number: 4,529,946
[45] Date of Patent: Jul. 16, 1985

[54] DIFFERENTIAL AMPLIFIER CIRCUIT

[75] Inventor: Hiromi Kusakabe, Yokohama, Japan

[73] Assignee: Tokyo Shibaura Denki Kabushiki Kaisha, Japan

[21] Appl. No.: 536,789

[22] Filed: Sep. 28, 1983

[30] Foreign Application Priority Data

Sep. 29, 1982 [JP] Japan ............................. 57-170375

[51] Int. Cl.$^3$ ............................................. H03F 3/45
[52] U.S. Cl. ................................................ 330/257
[58] Field of Search ............... 330/257, 288; 323/315, 323/316

[56] References Cited

FOREIGN PATENT DOCUMENTS 48-27664 4/1973 Japan .

Primary Examiner—James B. Mullins
Attorney, Agent, or Firm—Finnegan, Henderson, Farabow, Garrett & Dunner

[57] ABSTRACT

A differential amplifier circuit producing sufficient output current with a broad linear working range, which includes first and second transistors coupled at their emitters in differential amplifier configuration, an input circuit means connected between the bases of the first and second transistors, third and fourth transistors connected to the collectors of the first and second transistors constituting collector loads of the first and second transistors respectively, first resistor inserted between the bases of the third and fourth transistors, second and third resistors respectively inserted between the base and collector of each of the third and fourth transistors, and an output circuit means connected to the third and fourth transistors.

5 Claims, 9 Drawing Figures

DIFFERENTIAL AMPLIFIER CIRCUIT

BACKGROUND OF THE INVENTION

This invention relates to a differential amplifier circuit, and more particularly, to a differential amplifier circuit with a broad linear range of input to output characteristics.

Differential amplifier circuits are useful in integrated circuit (IC) design. In differential amplifier circuits it is required that each circuit produces the differential output current, and as far as possible, the effect of changes in the parameters of the amplifying elements such as transistors, etc., due to e.g., variations in temperature or the load, on their output should be suppressed. Many forms of the differential amplifier circuits have been developed and are widely used in a variety of analog circuits.

Two types of conventional differential amplifier circuits are shown in FIGS. 1 and 3 are and more fully discussed below in the Description of the Preferred Embodiment.

SUMMARY OF THE INVENTION

An object of the present invention is to provide a differential amplifier circuit which has a broad linear range of input to output characteristics.

Another object of the present invention is to provide a differential amplifier circuit which is able to produce sufficient output current.

These and other objects are achieved in the differential amplifier circuit of the present invention which includes first and second transistors coupled at their emitters in differential amplifier configuration, input circuit means connected between the bases of the first and second transistors, third and fourth transistors constituting collector loads of the first and second transistors respectively, first resistor inserted between the bases of the third and fourth transistors, second and third resistors respectively inserted between the base and collector of each of the third and fourth transistors, and output circuit means connected to the third and fourth transistors.

Additional objects, advantages, and features of the present invention will further become apparent to persons skilled in the art from a study of the following description and of the accompanying drawings, in which:

DESCRIPTION OF THE PREFERRED EMBODIMENT

Figure 1:
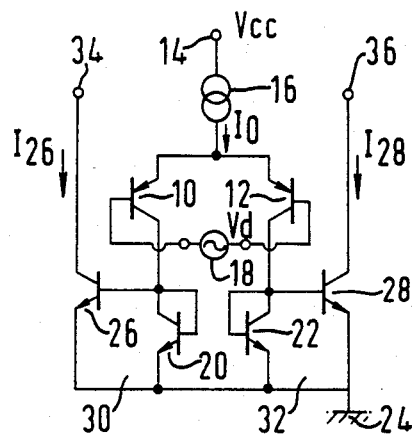
FIG. 1 is a circuit diagram of a conventional differential amplifier circuit.

The present invention will now be described in detail with reference to the accompanying drawings. Throughout the drawings like reference numerals and letters are used to designate like or equivalent elements for the sake of simplicity of explanation.

Referring now to FIG. 1, there is shown a differential amplifier circuit in common use, for instance with analog circuits. As shown, PNP transistors 10, 12 are respectively connected to the terminals of input signal source 18. Identical "diode-connected" NPN transistors 20, 22 are respectively connected between the collectors of transistors 10, 12 and reference potential terminal 24 so that they constitute the collector loads of transistors 10, 12. NPN transistors 26, 28 are respectively connected to transistors 20, 22 so as to constitute current mirror circuits 30, 32. The collectors of transistors 26, 28 can be connected to an external circuit (not shown) via output terminals 34, 36 respectively.

In FIG. 1, $I_O$ is a driving current supplied from power source terminal 14 to the common point of the emitters of transistors 10, 12, being regulated to a constant value via constant-current source 16. Also $V_d$ is a voltage of an input signal which is supplied from input signal source 18 to the bases of transistors 10, 12.

Figure 2:
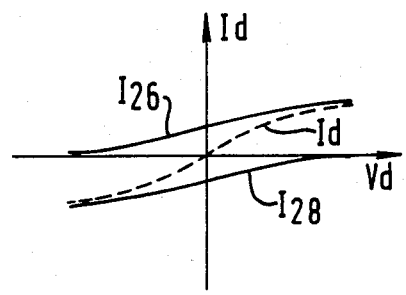
FIG. 2 shows the input to output characteristics of the circuit of FIG. 1.

In the conventional differental amplifier circuit shown in FIG. 1, collector currents $I_{26}$, $I_{28}$ of transistors 26, 28 are varied in proportion to input signal voltage $V_d$ as shown in FIG. 2. Output current $I_d$ of the conventional differential circuit of FIG. 1 is obtained as a differential current between collector currents $I_{26}$, $I_{28}$, that is, $I_d = I_{27} - I_{28}$ as shown by the broken line in FIG. 2. Output current $I_d$ is expressed by the following formula using input signal voltage $V_d$.

$$I_d = I_O \tanh(V_d/2V_T)$$

where $V_T$ is the thermal voltage, expressed as $V_T = KT/q$; k is Boltzmann's constant; q is the electron charge; and T is the absolute temperature.

Some problems arise due to output current $I_d$ of the conventional circuit of FIG. 1. That is, output current $I_d$ tends to saturate gradually with the increase in the absolute value of input signal voltage $V_d$. The range of linearity of output current $I_d$ is thus limited. The conventional circuit of FIG. 1 also has a disadvantage that when a large input signal is applied, a drive current or output current $I_d$ supplied through output terminals 34, 36 to the next amplification stage is insufficient.

Figure 3:
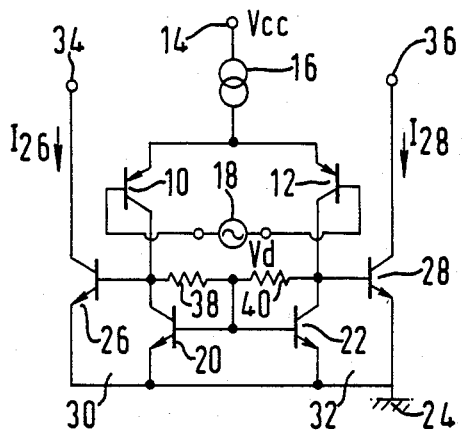
FIG. 3 is a circuit diagram of another conventional differential amplifier circuit.

Another type of conventional differential amplifier circuit is disclosed in Japanese Patent Publication Kokai No. 48-27664. A similar amplifier is shown in FIG. 3. Here, resistors 38, 40 are inserted in series between the collectors of transistors 20, 22. The connecting point of resistors 38, 40 is connected in common to the bases of transistors 20, 22. Other parts of FIG. 3 are equivalent to FIG. 1 and assigned the same symbols so that explanations thereof are eliminated.

In the conventional differential amplifier circuit of FIG. 3, collector currents $I_{10}$, $I_{12}$ of respective transistors 10, 12 increase as a result of the difference between collector currents $I_{10}$, $I_{12}$ which flows through resistors 38, 40 respectively. Collector currents $I_{26}$, $I_{28}$ of transistors 26, 28 are the same as the respective collector currents $I_{10}$, $I_{12}$ of transistors 10, 12 due to current mirror circuits 30, 32 shown in FIG. 4. If resistors 38, 40 are assumed to have equal resistance value $R_0$, differential output current $I_d$ ($I_d = I_{26} - I_{28}$) is as follows (as indicated by the broken line in FIG. 4).

$$I_d = I_O \sinh[(R_O I_O/V_T)\tanh(V_d/2V_T)]$$

Figure 4:
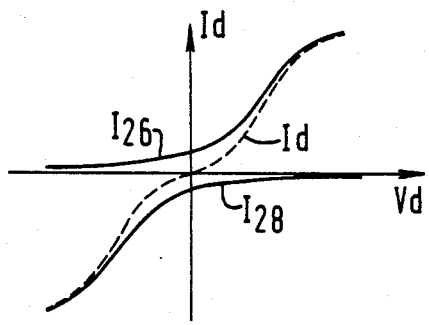
FIG. 4 shows the input to output characteristics of the circuit of FIG. 3.

The conventional circuit of FIG. 3 has an advantage that differential output current $I_d$ increases at higher voltages $V_d$ than that of the other conventional circuit of FIG. 1 so that output capability of current $I_d$ applied to the next amplifier stage is better. However, the non-linearity of output current $I_d$ to input signal voltage $V_d$ becomes worse, as shown in FIG. 4.

Figure 5:
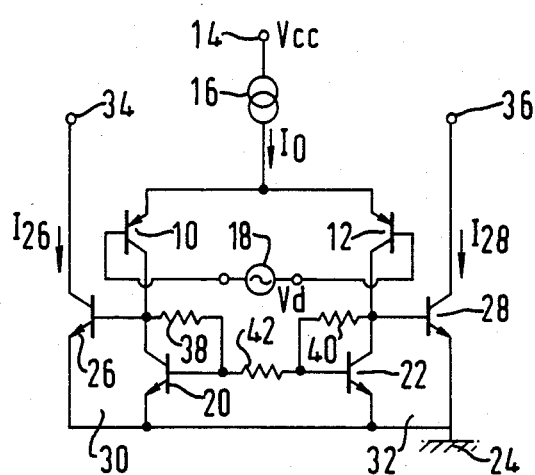
FIG. 5 is a circuit diagram showing an embodiment of the differential amplifier circuit of this invention.

Referring now to FIG. 5, there is shown in circuit diagram a differential amplifier circuit according to the present invention. As shown in FIG. 5, the differential amplifier circuit of this invention is constructed like the conventional amplifier circuit of FIG. 3 in some regards, but different from that of FIG. 3 in that resistor 42 is inserted between the bases of transistors 20, 22. Resistors 38, 40 are connected between the collector and base of respective transistors 20, 22. Other parts of the circuit are equivalent to FIG. 3 and assigned the same symbols so that explanations thereof are eliminated.

Figure 6:
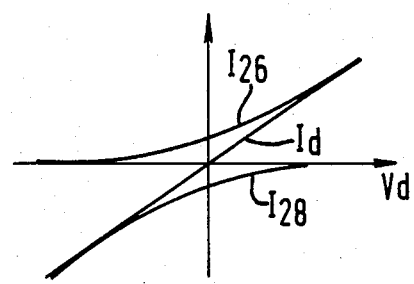
FIG. 6 shows the input to output characteristics of the circuit of FIG. 5.

In the differential amplifier circuit of FIG. 5, voltage drop $V_{42}$ across resistor 42 increases when current $I_{42}$ flows through resistor 42 caused by imbalance between collector currents $I_{20}$, $I_{22}$. Voltage drop $V_{42}$, acts to reduce the imbalance between collector currents $I_{20}$, $I_{22}$ by a negative feedback effect. Consequently, collector currents $I_{26}$, $I_{28}$ of transistors 26, 28 equivalent to respective collector currents $I_{20}$, $I_{22}$ of transistors 20, 22 due to current mirror circuits 30, 32 are as shown in FIG. 6. Differential output current $I_d$ is as indicated by the broken line in FIG. 6, and sufficient amount of the output current is obtained in accordance with the increase of input signal voltage $V_d$ with no loss of linearity of output current $I_d$ to input signal voltage $V_d$.

Theoretically, if the resistance value of resistor 42 is taken as $R_{42}$, and collector currents $I_{20}$, $I_{22}$ of transistors 20, 22 as $I_O(1+x)$ and $I_O(1-x)$ respectively, where x is a variation in current, the following relationships are obtained:

$$I_{42} \cdot R_{42} = V \cdot \ln[(1 + x)/(1 + x)]$$

$$I_{42} \cdot R_O = V \cdot \ln[2I_{10}/I_O (1+x)]$$

$$= V_T \cdot \ln[2I_{12}/I_o (1-x)]$$

From these formulae, the following relationships are then obtained.

$$I_d = I_O[1 + \tanh(I_{42} \cdot R_{42}/2V_T)]\sinh(I_{42}/V_T)$$

$$V_d = 2V_T \tanh^{-1}[(2I_d/I_O) + \tanh(I_O \cdot R_{42}/2V_T)]$$

Figure 7:
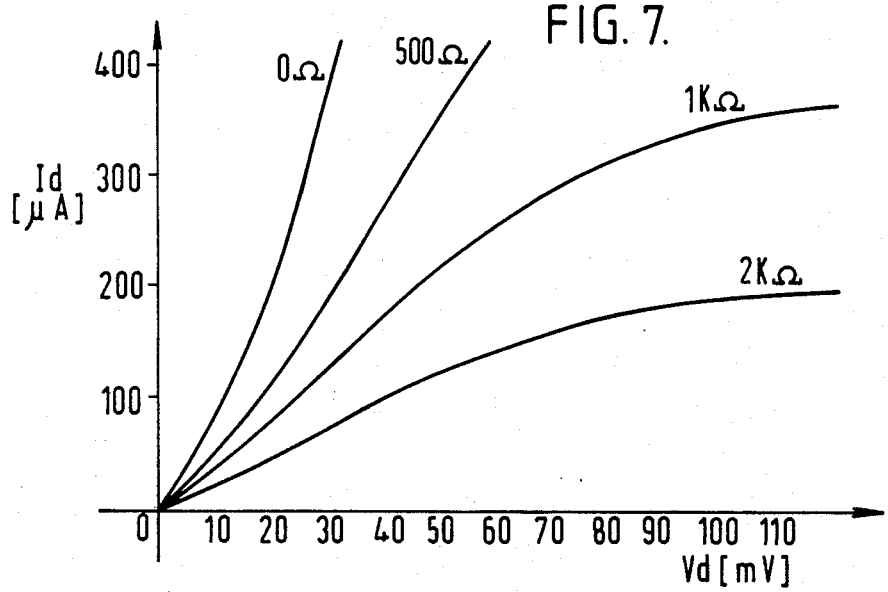
FIG. 7 shows the input to output characteristics with the resistance values of the resistor 42 in the circuit of FIG. 5 as parameters.

Now we assume, in the circuit of FIG. 5, that $I_O = 100$ μA, $R = 2$ kΩ, and $R_{42}$ is 0Ω, 500Ω, 1 kΩ, or 2 kΩ, the relation between input signal voltage $V_d$ and differential output current $I_d$ changes as shown in FIG. 7, and good characteristics are obtained for the range of $R_{42}$ from around 500Ω to 1 kΩ. (Note: the characteristics in the third quadrant are not shown in FIG. 7, but are symmetrical around the origin of the coordinate axis.)

Figure 8:
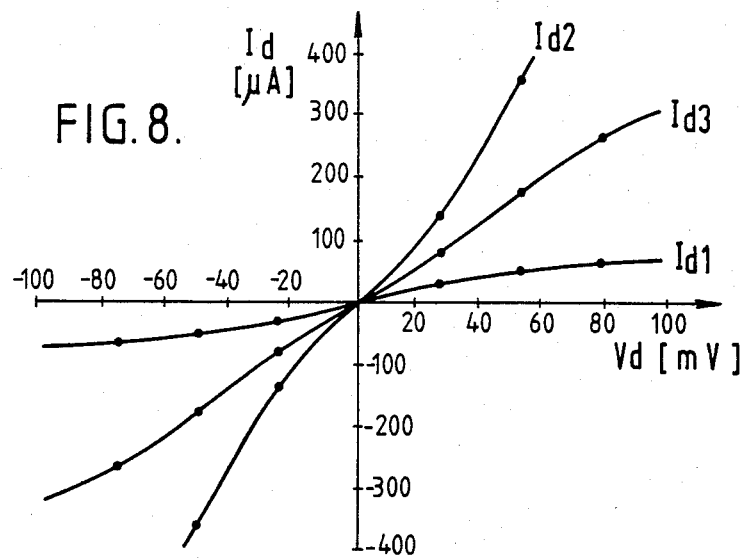
FIG. 8 compares the input to output characteristics of the circuits of FIGS. 1, 3 and 5.

Further, if in the differential amplifier circuit of FIG. 5 the resistance value $R_{42}$ of resistor 42 is set at $R_{42} = 2$ kΩ, with the other constants remaining the same, and a comparison is then made with the differential amplifier circuits FIGS. 1 and 3, it will be found that the differential output current characteristics of the respective circuits of FIGS. 1, 3 and 5 change as shown respectively by the curves $I_{d1}$, $I_{d2}$, $I_{d3}$ in FIG. 8, and that the characteristic exhibited by the differential amplifier circuit of FIG. 5 is extremely good.

This invention is not limited to the embodiment described above. It can also be embodied in the form shown in FIG. 9. No further explanation is given here of the parts which FIG. 9 shares with FIG. 5 and which are assigned the same symbols. Here, resistors 44 and 46 are inserted in an identical way between the collector of transistor 20 and the base of transistor 26 and between the collector of transistor 22 and the base of transistor 28 respectively. If voltage drops of resistors 38, 40, 44 and 46, in the no-signal state of the circuit of FIG. 9, are set to be equal in each case, the effect of inequality in the characteristics of transistors 10, 12, 20, 22, 26 and 28 is reduced to a minimum.

Figure 9:
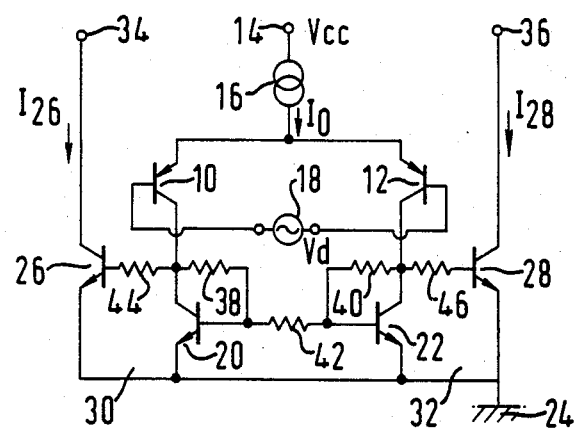
FIG. 9 is a circuit diagram of another embodiment of the invention.

Further, the differential amplifier circuits of FIGS. 5 and 9 can be constructed with each of the transistors of the opposite conductivity type.

Various other modified forms and applications of the invention are also possible, provided there is no departure from its essential substance.

What is claimed is:

1. A differential amplifier circuit comprising:
    first and second transistors coupled at their emitters with each other in differential amplifier configuration;
    input circuit means connected between the bases of said first and second transistors;
    third and fourth transistors connected to the collectors of said first and second transistors constituting collector loads of said first and second transistors respectively;
    first resistor inserted between the bases of said third and fourth transistors;
    second and third resistors respectively inserted between the base and collector of each of said third and fourth transistors; and
    output circuit means connected to said third and fourth transistors.

2. A differential amplifier circuit according to claim 1, wherein said second and third resistors have equal resistance value.

3. A differential amplifier circuit according to claim 1, wherein said output circuit means is comprised of fifth and sixth transistors having their bases connected to said third and fourth transistors to constitute first and second current mirror circuits together with said third and fourth transistors respectively.

4. A differential amplifier circuit according to claim 3, further comprising:
    fourth and fifth resistors respectively connected to the bases of said fifth and sixth transistors and to the collector of the third and fourth transistor.

5. A differential amplifier circuit according to claim 4, wherein said second to fifth resistors each has the same resistance value.

* * * * *